(12) United States Patent
Zinke et al.

(10) Patent No.: US 8,909,971 B2
(45) Date of Patent: Dec. 9, 2014

(54) CLOCK SUPERVISION UNIT

(75) Inventors: Manfred Zinke, Aachen (DE); Peter Fuhrmann, Aachen (DE); Markus Baumeister, Munich (DE)

(73) Assignee: NXP B.V., Eindhoven (NL)

( * ) Notice: Subject to any disclaimer, the term of this patent is extended or adjusted under 35 U.S.C. 154(b) by 862 days.

(21) Appl. No.: 12/675,867

(22) PCT Filed: Aug. 20, 2008

(86) PCT No.: PCT/IB2008/053329
§ 371 (c)(1),
(2), (4) Date: Mar. 1, 2010

(87) PCT Pub. No.: WO2009/031060
PCT Pub. Date: Mar. 12, 2009

(65) Prior Publication Data
US 2010/0308868 A1 Dec. 9, 2010

(30) Foreign Application Priority Data
Sep. 3, 2007 (EP) .................................. 07115502

(51) Int. Cl.
*G06F 1/14* (2006.01)
*H03K 5/19* (2006.01)
*G06F 11/16* (2006.01)

(52) U.S. Cl.
CPC .............. *G06F 11/1604* (2013.01); *H03K 5/19* (2013.01); *G06F 1/14* (2013.01)
USPC ............................................ 713/500; 327/20

(58) Field of Classification Search
CPC ......... G06F 11/1604; G06F 1/12; G06F 1/14; H03K 5/19; H03L 7/00; H04J 3/0694; H04L 12/44
USPC ............. 713/400–401, 500–503, 600; 327/20
See application file for complete search history.

(56) References Cited

U.S. PATENT DOCUMENTS 4,374,361 A 2/1983 Holden
5,301,171 A 4/1994 Blow et al.
(Continued)

FOREIGN PATENT DOCUMENTS

DE 101 48 325 A1 4/2003
EP 0 385 404 A2 9/1990
(Continued)

OTHER PUBLICATIONS

International Search report dated Mar. 19, 2009 for PCT/IB2008/053329.

*Primary Examiner* — Fahmida Rahman

(57) ABSTRACT

The present invention relates to a clock supervision unit (100) and an electronic system clocked by at least one clock (c*) and using the clock supervision unit (100). The clock supervision unit (100) analyzes the at least one clock (c*) based on a monitor clock (m*) provided together with the at least one clock (c*) or separately to the clock supervision unit (100). The clock supervision unit (100) at least comprises an activity unit (210), a deviation unit (220) and an auxiliary clock generator (240). The auxiliary clock generator (240) outputs an auxiliary clock (a*). The activity unit (210) detects the presence of the monitor clock (m*) based on the auxiliary clock (a*) and the presence of the auxiliary clock (a*) based on the monitor clock (m*). The deviation unit (220) detects clock faults in the monitor clock (m*) based on the auxiliary clock (a*). With the clock supervision unit (100) according to the present invention, the at least one clock (c*) can be supervised in more detail and it is possible to react on different clock faults in the at least one clock c* with different error handling procedures, e.g. by initiating a shutdown of the devices controlled by the electronic system.

17 Claims, 5 Drawing Sheets

(56) References Cited

U.S. PATENT DOCUMENTS

| | | | |
|---|---|---|---|
| 5,313,476 A | 5/1994 | Haberkorn, Jr. et al. | |
| 5,642,069 A * | 6/1997 | Waite | 327/292 |
| 5,648,759 A | 7/1997 | Miller et al. | |
| 6,466,058 B1 * | 10/2002 | Goldman | 327/49 |
| 6,590,949 B1 | 7/2003 | Marten et al. | |
| 6,665,367 B1 * | 12/2003 | Blair | 377/20 |
| 7,089,462 B2 | 8/2006 | Floyd et al. | |
| 7,427,881 B2 * | 9/2008 | Starr et al. | 327/99 |
| 2003/0040328 A1 * | 2/2003 | Indirabhai | 455/502 |
| 2003/0067873 A1 | 4/2003 | Fuhrmann et al. | |
| 2003/0115503 A1 | 6/2003 | Lehman et al. | |

FOREIGN PATENT DOCUMENTS

| | | |
|---|---|---|
| JP | 05 041643 A | 2/1993 |
| JP | 2008 258861 A | 10/2008 |
| WO | 95/21412 A | 8/1995 |

* cited by examiner

CLOCK SUPERVISION UNIT

FIELD OF THE INVENTION

The present invention relates to a clock supervision unit and to an electronic system comprising the clock supervision unit for supervising the at least two clocks, in particular internal clocks of the electronic system.

BACKGROUND OF THE INVENTION

The ongoing development of cars with respect to driving safety and increased requirements with respect to entertainment and infotainment results in a drastical increase of electronic modules in the car. Most of the electronic modules are integrated on a chip, wherein each electronic module includes a plurality of different functions, each integrated on one chip. Such electronic modules including different functions on one chip are micro controller units, called MCU. A plurality of safety-relevant applications in the automotive area, like airbags, ABS or the like require a reliable operation.

The reliable operation of MCUs and peripheral devices connected to MCUs strongly depends on valid clock signals. The reliable operation of the MCU may also be influenced by diagnostic units included or connected to the MCU. All of them, the MCU, the peripheral devices and the diagnostic units need to be supplied with reliable and stable clock signals. Clock faults like a missing clock or a deviation of the clock frequency can be critical for the operation of MCUs, especially in safety relevant applications. Such clock faults may for example prevent the execution of a safety function or may deactivate online-diagnostics.

When detecting a clock fault, an appropriate reaction must be initiated, which depends on the application requirements. In case of a critical clock failure it may be required to bring the whole system into a safe state. Conventionally all clocks used within the MCU are directly or indirectly derived from a system clock, which is used as reference for the detection of missing clock faults and for detecting frequency deviations by calculating the ratio between the frequency of such a derived clock within the MCU and the system clock frequency. In case that the ratio misses a predetermined value, a clock fault is detected. In other words, the correct detection of a clock fault relies on the presence of a correct system clock.

OBJECT AND SUMMARY OF THE INVENTION

It is therefore an object of the present invention to provide a clock supervision unit, which is able to detect a clock fault, in particular clock faults like a missing clock or a clock, which is running too fast or too slow.

It is further an object of the invention, to classify clock faults to enable the clock supervision unit to react autonomously on critical clock faults and to indicate less critical clock faults to software or to a system supervisor unit.

The invention therefore proposes a clock supervision unit with an auxiliary clock, an activity unit and a deviation unit. The auxiliary clock may be generated inside the clock supervision unit or provided from externally. The clock supervision unit analyzes at least one clock based on a monitor clock and providing information about the at least one clock. In detail, the activity unit detects the presence of the monitor clock based on the auxiliary clock and the presence of the auxiliary clock based on the monitor clock. Further, the deviation unit analyzes the frequency of the monitor clock based on the auxiliary clock. By ensuring, that the monitor clock runs correctly, the clock supervision unit can analyze all clocks of the at least one clock independent from each other. Now, the clock supervision unit can react autonomously and differently on clock faults. E.g. clock faults occurred in a system critical clock like a system clock, which is clocking a central processing unit or an interface to an actuator could be handled by initiating a shutdown. Clock faults occurred in less critical periphery clocks could be handled by e.g. software. Additionally, the clock supervision unit can classify clock faults. That is, an error handling procedure performed in case of a missing monitor clock can differ from an error handling procedure performed if the monitor clock frequency slightly deviates from a specified value.

The activity unit preferably may comprise a monitor clock missing unit and an auxiliary clock missing unit. Therein, the monitor clock missing unit is clocked by the auxiliary clock and continuously reset by the monitor clock. The monitor clock missing unit steadily outputs a signal as long it is clocked by the auxiliary clock and reset by the monitor clock. This signal is changing after a predetermined elapsed time, derived from the auxiliary clock, if the monitor clock missing unit is not reset. The predetermined elapsed time restarts each time the monitor clock missing unit is reset by the monitor clock.

The auxiliary clock missing unit is clocked by the monitor clock and continuously reset by the auxiliary clock. It steadily outputs a signal as long as it is clocked by the monitor clock and reset by the auxiliary clock. This signal is changing after a predetermined elapsed time, derived from the monitor clock, if the auxiliary clock missing unit is not reset. The predetermined elapsed time restarts each time the auxiliary clock missing unit is reset by the auxiliary clock.

Due to the high relevance of a clock loss for the system safety in an electronic system, especially in a MCU, the activity unit fulfills a plurality of tasks. If the electronic system comprises so-called phase looked loops, hereinafter called PLL, to generate clock signals derived from the at least one clock, the PLL runs freely if the at least one clock is missing. Therewith, the PLL would produce faulty clock signals. This is prevented by detecting the clock loss with the activity unit and initiating an appropriate reaction. Further, a missing clock may prevent diagnostic units from operating, such that the detection of dangerous faults is impossible.

The deviation unit may receive the monitor clock and the auxiliary clock to detect a frequency fault in the monitor clock based on the auxiliary clock. If the monitor clock runs with a wrong frequency, the supervision of the at least one clock is imprecise and/or erroneous. Further, if the monitor clock and the at least one clock to be supervised are derived from a shared clock and the shared clock is erroneous, then frequency errors in the at least one clock to be supervised cannot be reliably detected. However, if the at least one clock is running too slow or too fast in an electronic system, this may prevent or degrade the execution of a safety function. Such clock fault may also result in diagnostic and error preventive procedures not running in the designated way, such that a dangerous failure would not be detected or the preventive procedure would not be executed within the specified system safety time. Therefore, the deviation unit recognizes a wrong clock frequency in the monitor clock and initiates an appropriate counter action in case of a clock fault.

Preferably, the deviation unit may comprise a monitor clock counter counting the number of clocks of the monitor clock within a time window determined based on the auxiliary clock. Therein, a clock deviation fault is indicated if the frequency of the monitor clock deviates from a predetermined frequency within the time window. The advantage of such deviation unit is that the duration of the time window can easily be adjusted to the requirements of supervising different monitor clock frequencies within a large frequency range. Such adjustment can for example be performed by means of a configurable counter for deriving the time window from the auxiliary clock.

In a preferred embodiment of the inventive clock supervision unit, the deviation unit outputs different clock deviation faults indicating:

1. A frequency high error, if the monitor clock frequency is higher than a predetermined monitor clock frequency. A too high clock frequency may result in a hazard due to random data or instructions read from a system bus. Such a hazard may be prevented by reacting on this clock deviation fault, e.g. by initiating a system shutdown.

2. A frequency low warning, if the monitor clock frequency is lower than the first predetermined monitor clock frequency, but higher than a second predetermined monitor clock frequency, respectively. Such too low clock frequencies may prevent the correct operation of peripheral units that are required for interaction with external devices, connected to the MCU. This applies especially to communication interfaces. With the clock deviation fault indicating a frequency low warning, the MCU, or the electronic system is able to repair the respective clock or to reset the MCU.

3. Alternatively or additionally, the clock deviation fault may indicate a frequency low error, if the monitor clock frequency is lower than the second predetermined monitor clock frequency. If a clock frequency is too low, the electronic system is not able to react within the system safety time on the detection of dangerous faults. Therefore, the clock deviation fault indicating a frequency low error enables the clock supervision unit according to the present invention to initiate suitable error handling reactions to bring the system into a safe state.

The clock supervision unit may further comprise an internal oscillator providing the auxiliary clock. This makes the clock supervision independent from any problem occurred due to supplying an external auxiliary clock to the clock supervision unit.

Moreover, the object is also solved by an inventive electronic system adapted to receive an external clock for clocking the electronic system, wherein the electronic system is adapted to provide at least one periphery clock for clocking at least one periphery device connected to or integrated into the electronic system, wherein the electronic system is coupled to a clock supervision unit as described above for analyzing the at least one periphery clock and the monitor clock both created based on the external clock.

The clock supervision unit is able to detect a clock fault in the system clock and in the at least one periphery clock and to initiate appropriate error handling reactions in case of clock faults. As already discussed, if a monitor clock provided to the clock supervision unit does not work properly, an auxiliary clock is used to detect the malfunction. If the auxiliary clock is erroneous, the clock supervision unit looses its double protection, but the monitor clock is used to detect and to optionally initiate appropriate error handling procedures.

Preferably, the clock supervision unit is adapted to initiate a shutdown of at least one component connected to the electronic system or included in the electronic system in case of predetermined clock fault in the at least one periphery clock, in the monitoring clock, in the auxiliary clock or in the external clock. This comprises the advantage, that the clock supervision unit is able to autonomously initiate a shutdown independently from other diagnostic units.

Preferably, the electronic system further comprises a deciding unit connected to the clock supervision unit and adapted to initiate a shutdown of the electronic system or an error handling procedure based on the output of the clock supervision unit. Such a deciding unit is very suitable for flexibly reacting on clock faults and is further independent from the clock supervision unit.

The deciding unit is preferably adapted to initiate a shutdown of at least one component connected to the electronic system and/or included in the electronic system, if at least one missing clock error or at least one frequency low error or at least one frequency high error is received. As described, a frequency low error or a clock missing error prevents the electronic system from operating and the frequency high error leads to a hazard due to random data or instructions read from a bus, if such an error applies for a critical clock. Therefore, a shutdown is instructed by the deciding unit and a safe reaction is performed to prevent the hazard in such a case.

Additionally or alternatively, the deciding unit may initiate an error handling procedure if at least one frequency low warning is received or a clock missing error for a non-critical clock is received. As already discussed, a frequency low warning is indicating that the electronic system is running with limited performance or limited functionality. Therefore, an error handling procedure could be started to try to repair the clock, e.g. by resetting the clock generation unit, which is responsible to derive the clock from the system clock, and thereby to bring the electronic system back into operation with normal performance and functionality.

The deciding unit could further be clocked by an autonomous clock independent from other clocks within the electronic system. This is a suitable further protection against clock faults in the electronic system. If a clock fault occurs as for example in the system clock, the deciding unit will also fail in its function. Therefore, an autonomous clock provided in the deciding unit could provide freedom of action to the deciding unit even if the system clock failed.

In case that the deciding unit is provided by an autonomous clock, the clock of the deciding unit is also supervised by the clock supervision unit, such that a loss of the additional autonomous clock does not lead to an undetected dangerous fault.

Moreover, the deciding unit may analyze a reason for the at least one frequency low warning, to drive information about the reason and to either provide the information to a display or to initiate an automatic repair in the error handling procedure. Information about the reason of a frequency low warning could help to more quickly repair an electronic system for a technician.

In a preferred embodiment of the electronic system, the monitor clock is directly or indirectly derived from the system clock. This saves at least one clock generating circuit.

Moreover, the deciding unit of the electronic device may initiate a periphery error handling procedure based on information about the at least one periphery clock received from the clock supervision unit.

The external clock may be provided by a crystal oscillator. This is a very suitable embodiment of the invention. A crystal oscillator provides a very precise clock frequency and can only oscillate on predetermined resonance frequencies, so-called harmonics. These resonant frequencies are distanced to each other. That is, if the crystal oscillator has a malfunction, it most probably provides a clock frequency at the wrong resonance frequency and it is easy to detect such fault by the clock supervision unit based on the auxiliary clock and thereby increasing the system safety.

If further the monitor clock is provided by an external independent oscillator, the monitor clock and the clock to be supervised are not correlated to each other. Thus the detectability of errors in the clocks to be supervised is increased.

Alternatively, the monitor clock may be directly or indirectly derived from the external clock. This would save a further clock source for the electronic system and therefore save place and manufacturing costs.

The auxiliary clock of the clock supervision unit may be preferably provided by a ring oscillator or an RC-oscillator, e.g. an astable multivibrator. Such oscillators are cheap, can easily be integrated into the electronic system, and provide sufficient precision for detecting frequency deviations of a crystal oscillator for the external clock, if running at the wrong resonance frequency. In a preferred embodiment, the ring oscillator or the RC-oscillator are provided within the electronic system.

In a further embodiment, the ring oscillator or the RC-oscillator are provided external to the electronic system.

BRIEF DESCRIPTION OF THE DRAWINGS

The invention will now be described based on the following detailed description and on the drawings, in which.

DESCRIPTION OF EMBODIMENTS

Figure 1:
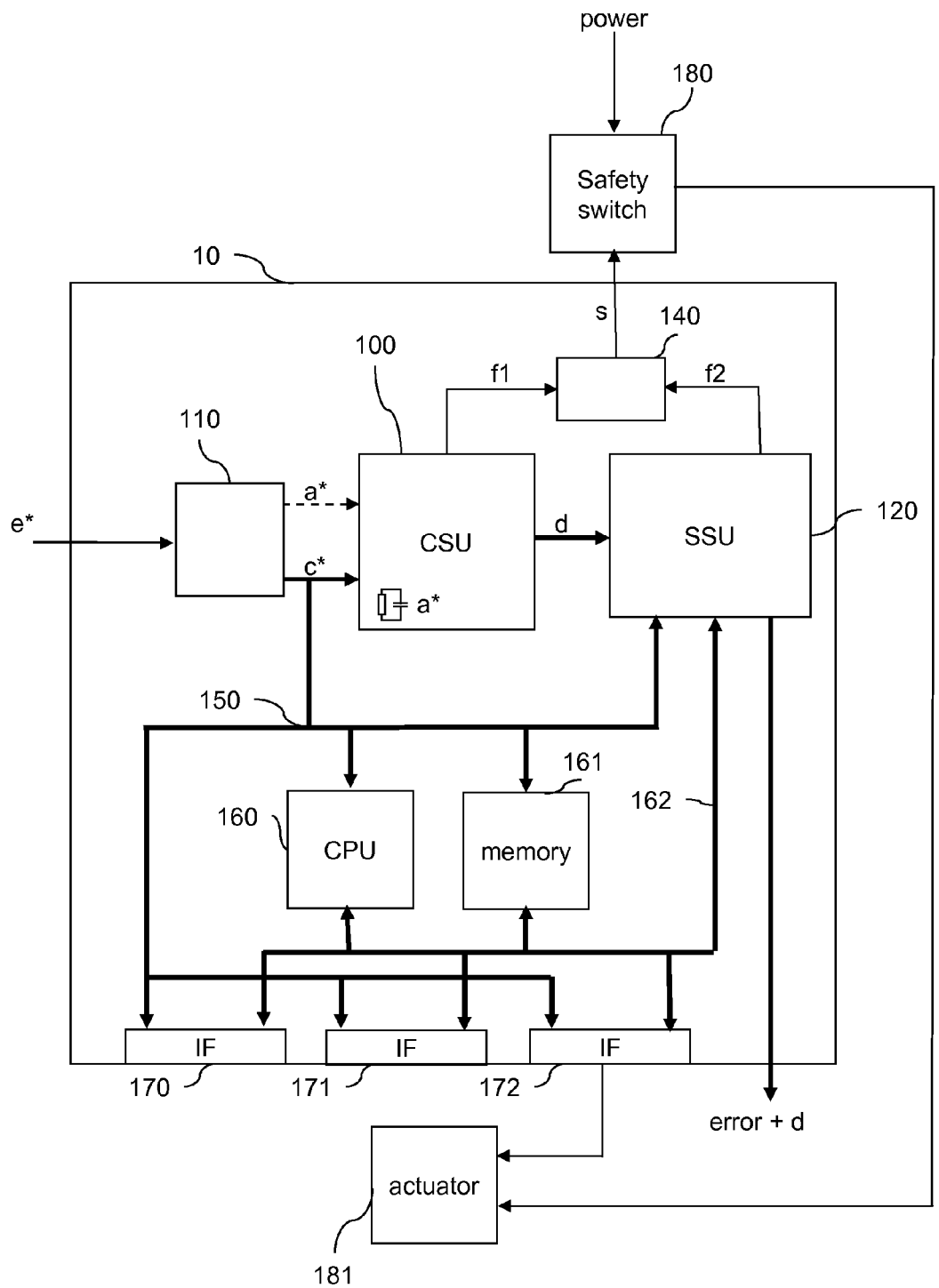
FIG. 1 shows a preferred embodiment of a MCU using the clock supervision unit according to the invention.

FIG. 1 shows a preferred embodiment of a MCU 10 using a clock supervision unit 100 according to the present invention. The MCU 10 comprises the clock supervision unit 100, hereinafter called CSU, a clock generation unit 110, a system supervision unit 120, hereinafter called SSU, a shutdown initiation unit 140, a clock bus 150, a central processing unit 160, hereinafter called CPU, a memory 161, a system bus 162 and three peripheral interfaces 170-172, hereinafter called IF. A safety switch 180 and an actuator 181 are connected to the MCU 10.

The clock generation unit 110 receives an external clock e* provided from outside the MCU 10 and at least outputs a set of periphery clocks c*. The CSU 100 receives the set of periphery clocks c* and generates based on the received set of periphery clocks c* an information signal d provided to the SSU 120. Further, the CSU 100 generates a first shutdown initiation signal f1 provided to the shutdown initiation unit 140. The SSU 120 receives the information signal d and generates a second shutdown initiation signal f2 provided to the shutdown initiation unit 140. Further, the SSU 120, the CPU 160, the memory 161 and the three IFs 170-172 are interconnected over the system bus 162. Synchronously, the SSU 120, the CPU 160, the memory 161 and the three IFs 170-172 receive one of the periphery clocks c* provided by the clock generation unit 110. All three IFs 170-172 may be connected to a periphery device. In the present embodiment, the third IF 172 is connected to the actuator 181.

After receiving the external clock e*, the clock generation unit 110 derives, based on the external clock e*, the set of periphery clocks c*. These are necessary clocks c* to drive the SSU 120, the CPU 160, the memory 161 and the three IFs 170-172. The generated set of periphery clocks c* is applied to the clock bus 150. This clock bus 150 supplies the set of periphery clocks c* to above mentioned units within the MCU 10.

Additionally, the CSU 100 is supplied with all clocks of the set of periphery clocks c*. Inside the CSU 100, an auxiliary clock a* is generated. Further, one designated clock of the set of periphery clocks c* is chosen by the CSU 100, which is then verified by the auxiliary clock a* whether this designated clock runs correctly. To increase the system safety, the presence of the auxiliary clock a* is detected based on the designated clock. Preferably, the designated clock is the external clock e* itself, which is included into the set of periphery clocks c* without any amendment. It may also be supplied to the CSU 100 directly, without passing the clock generation unit 110. Alternatively, as indicated by a dashed arrow in FIG. 1, the auxiliary clock may be generated in the clock generation unit 110 and provided to the clock supervision unit 100.

It is necessary to detect at least two types of errors in the external clock e*. A first error type is, that the external clock e* is not present. In this case, the CSU 100 needs to autonomously transfer the actuator 181 into a safe state. In the present embodiment, this safe state is reached by initiating a shutdown. Therefore, the CSU 100 outputs the first shutdown initiation signal f1 to instruct the shutdown initiation unit 140 for sending a shutdown signal s to the safety switch 180. The safety switch 180 then de-energizes the actuator 181. The function of the shutdown initiation unit 140 will be explained later. After de-energizing the actuator 181, the MCU 10 may be reset.

A further error is, that the external clock e* deviates from a specified frequency. In this case, the CSU 100 needs to categorize the frequency deviation into high critical faults and less critical faults. In case of high critical faults, the actuator 181 must be brought into a safe state. Therefore, the CSU 100 initiates a shutdown in the same way as explained above. In case of less critical faults, the CSU 100 creates the information signal d including information about the less critical faults and provides it to the SSU 120. Based on the information signal d the SSU 120 decides the appropriate reaction to the detected fault.

In case that the external clock e* is error free, the CSU 100 checks the remaining clocks in the set of periphery clocks c* in respect to errors based on the external clock e*. Therein, the presence of each clock within the set of periphery clocks c* and the correct frequency of each clock within predetermined limits is supervised. The CSU 100 finally analyzes the clock faults in the set of periphery clocks c* and determines whether there is a clock fault in the set of periphery clocks potentially causing a hazard. In this case, the CSU 100 immediately initiates a shutdown according to the procedure described above. Otherwise, the CSU 100 includes the information into the information signal d and provides it to the SSU 120.

Preferably, the CSU creates the information signal d including information about the clock faults even if a shutdown is initiated. In this case, the SSU 120 may be able to log the information into a nonvolatile memory as described later.

The CSU 100 according to the present invention comprises the following advantage. By selecting one designated clock out of the set of periphery clocks c* and checking it based on the auxiliary clock a*, a predetermined reliability for this one designated clock is reached. In a next step, all remaining clocks in the set of periphery clocks c* may be supervised individually based on the one designated clock checked in the first step. That is, it is possible to individually receive information about each clock within the set of periphery clocks. Therefore, the CSU 100 can classify a broader variety of error types making the MCU 10 more flexible in reacting on clock errors.

In a preferred embodiment, the external clock e* is provided by a crystal oscillator. As well known for a skilled person, a crystal oscillator can only oscillate on predetermined resonance frequencies. Minor frequency deviations of the crystal oscillator frequency due to frequency drift or crystal tolerances are not relevant for clocking an MCU.

In other words, a crystal oscillator only provides clock signals with discrete frequencies. That is, the CSU 100 according to the present invention is especially advantageous. Based on the auxiliary clock a*, it is determined whether the external clock e*, namely the crystal oscillator, oscillates on the correct resonance frequency. Therewith, the requirements to the auxiliary clock a* are not extremely high because the resonance frequencies of the crystal oscillator are displaced broad to each other. In other word, even if the auxiliary clock a* is generated by a very imprecise oscillator like a ring oscillator with a tolerance of about 20%, the external clock e* could be assumed as running correctly, if the detection result indicates the correct resonance frequency. Accordingly, if the external clock e* is identified as running correctly, the remaining clocks in the set of periphery clocks c* can be supervised within small tolerance ranges based on the external clock e*.

Looking to the SSU 120, it receives the information signal d including information about the set of periphery clocks c*. As already mentioned, preferably, the set of periphery clocks also includes the external clock e*. The SSU 120 may be clocked by one clock of the set of periphery clocks c*. The SSU 120 may be clocked with an autonomous clock independent from the external clock e*. In this case, this autonomous clock must also be supervised by the CSU 100. The SSU 120 gets informed about all clock faults, which not immediately lead to a system shutdown initiated by the CSU 100. Based on the information signal d, the SSU 120 may initiate predetermined error handling procedures. These error handling procedures comprise amongst others a communication to a functional unit affected by a clock fault to detect whether the functional unit is running correctly, an initiation of a MCU reset or even an initiation of a system shutdown. In the latter case, the SSU 120 outputs a second shutdown initiation signal f2 to the shutdown initiation unit 140, which initiates a shutdown of the actuator 181 in the above described way. More details about the functionality of the SSU 120 will be given later.

The CPU 160, the memory 161 and IFs 170-172 are elements of the MCU 10, which receive one of the clocks generated by the clock generation unit 110. As described above, the SSU 120 is adapted to initiate an error handling procedure. Usually, if the SSU 120 not initiates a shutdown, the CPU 160 is instructed to perform a predetermined error handling procedure. This instruction is communicated via the system bus 162. The CPU 160 may read an appropriate program from the memory 161 and execute the according error handling procedure and response the result to the SSU 120. However, if the clock driving the CPU 160 itself is affected by a clock fault, an error handling procedure independent from the CPU 160 must be initiated. Therefore, a clock fault of the clock driving the CPU 160 is an example, which may require that either the SSU 120 or the CSU 100 initiates a shutdown.

That is, the MCU 10 comprising the CSU 100 according to the present invention is able to individually react on clock faults. On the one hand, the detection of a critical clock fault that could lead to a hazard forces the CSU 100 to autonomously initiate a shutdown of the safety relevant elements. This is e.g. the actuator 181 connected to the MCU 10. In case of clock faults, which are regarded as repairable or not critical to the whole system, the CSU 100 reports the clock fault to the SSU 120. The SSU 120 is then able to initiate an error handling procedure and to decide further system relevant steps, in case that the clock fault was not eliminated by the error handling procedure.

Figure 2:
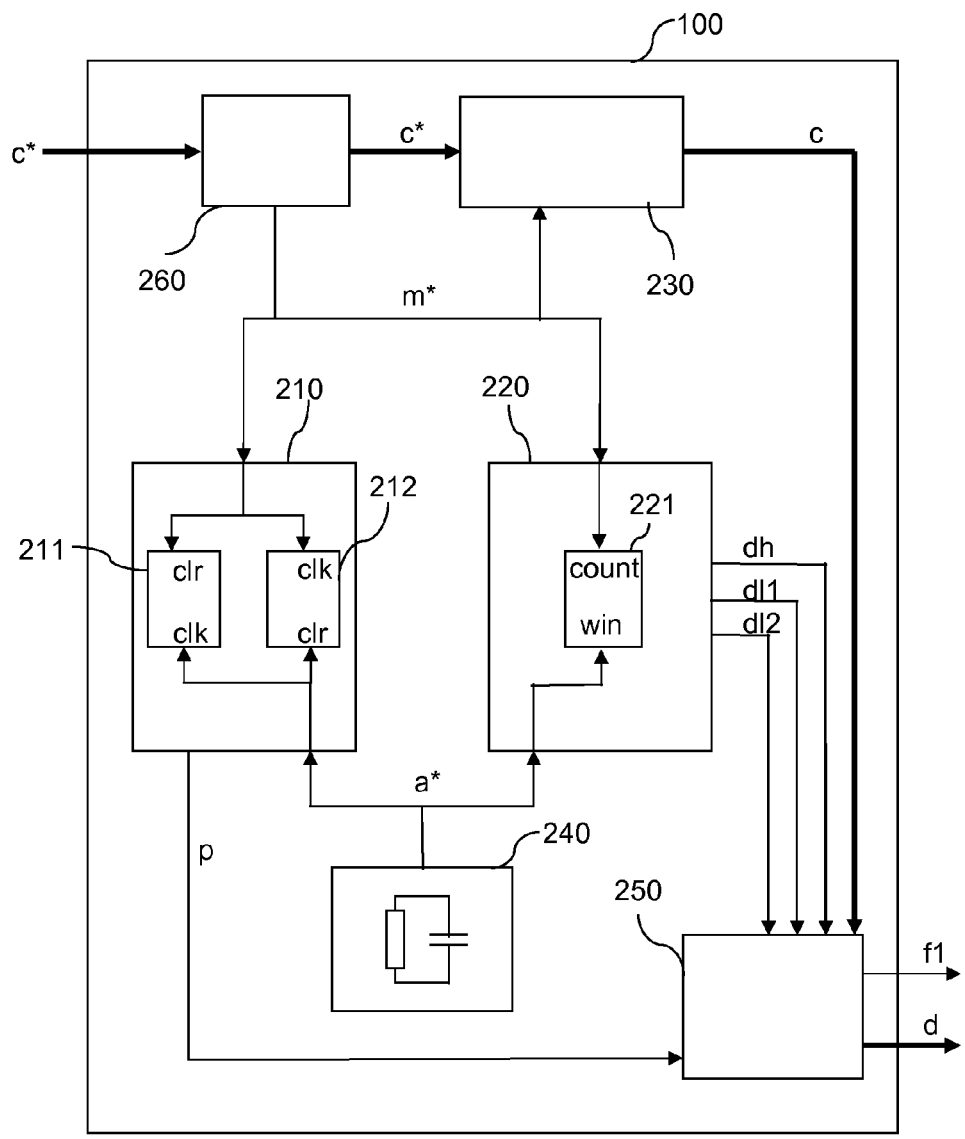
FIG. 2 shows an embodiment of the clock supervision unit according to the invention.

FIG. 2 shows an embodiment of the clock supervision unit according to the invention. The CSU 100 comprises an activity unit 210, a deviation unit 220, a configurable clock supervisor 230, an internal clock generator 240, a event analyzer 250 and a clock selector 260.

The clock selector 260 receives the set of periphery clocks c* from the clock generation unit 110 and selects the clock, which should be used to supervise all other clocks in the set of periphery clocks c*. As mentioned above, this is preferably the external clock e*. This designated clock is indicated by the reference sign m* and named monitor clock m* in the following. The monitor clock m* is supplied to the activity unit 210 and to the deviation unit 220. The internal clock generator 240 provides the auxiliary clock a* to the activity unit 210 and to the deviation unit 220. Based on the monitor clock m* and on the auxiliary clock a* the activity unit 210 detects, whether both clocks are present. The result is a presence signal p output to the event analyzer 250 indicating the presence of each of these two clock signals. The deviation unit 220 analyzes the correct frequency of the monitor clock m* based on the auxiliary clock a*. In case it detects a frequency deviation of the monitor clock m* the deviation unit 220 is adapted to output either a deviation high signal, if the frequency is too high, a deviation low warning, if the frequency is too low but higher than a predetermined critical limit or a deviation low error, if the frequency is below the predetermined critical limit. The output of the deviation unit 220 is supplied to the event analyzer 250. Finally, the monitor clock m* is applied to the configurable clock supervisor 230. Based on the monitor clock m* the configurable clock supervisor 230 derives clock information c about all clocks included in the set of periphery clocks c*. These clock information c may comprise the presence of each clock, information about frequency deviations of each clock, the amplitude of each clock or other suitable information, which is necessary to guarantee the reliable operation of the MCU 10 and to avoid hazards that could result from invalid control information output to the actuator 181. Also the clock information c is finally fed into the event analyzer 250. The event analyzer 250 may output, based on the inputted information, the first shutdown initiation signal f1 in case that the inputted information indicates a critical clock fault that could cause a hazard and/or cannot be repaired. As mentioned above, this is especially the case, if the monitor clock m* runs to fast or much too slow. Other possibility are for example, that the clock for the CPU 160 or the clock for the SSU 120 is missing. A further possibility is that the IF 172 looses its clock and no further data can be transmitted to the actuator 181, which could be a servomotor which urgently requires control data in order to avoid a dangerous situation. In such a case, there is no time to start an error handling procedure and the servomotor (actuator) 181 must be brought into a safe state immediately. In case of such a fault the event analyzer 250 would activate the first shutdown initiation signal f1. The event analyzer 250 also outputs the information signal d, which includes all clock information provided from the activity unit 210, the deviation unit 220 and the configurable clock supervisor 230.

The activity unit 210 comprises a monitor clock missing unit 211 and an auxiliary clock missing unit 212. The monitor clock missing unit 211 comprises a counter, which is clocked by the auxiliary clock a* for defining a time-out after which the monitor clock m* is detected as missing. In detail, at start, the monitor clock missing unit 211 outputs a first signal indicating that the monitor clock m* is present. After the time-out, the output of the monitor clock missing unit 211 switches to a second signal indicating, that the monitor clock m* is missing. However, the monitor clock m* resets counter of the monitor clock missing unit 211 with each clock cycle. That is, the time-out, after which the monitor clock missing unit 211 indicates a missing monitor clock m* by the second signal, is periodically restarted. In line with the monitor clock missing unit 211, the auxiliary clock missing unit also comprises a counter. That is, the operation of the auxiliary clock missing unit 212 is the same as the operation of the monitor clock missing unit 211. However, the counter of auxiliary clock missing unit 212 is clocked by the monitor clock m* and repeatedly reset by the auxiliary clock a*. In the most simple case, the presence signal p outputted by the activity unit 210 simply indicates the presence of both, the monitor clock m* and the auxiliary clock a*. However, preferably, the presence signal p indicates further information. This can comprise which clock is missing and/or a timer signal indicating the missing time. Therewith, not only a missing clock could be reliably detected. The event analyzer 250 is further able to evaluate the criticality of the clock fault. As for example, in contrary to a missing monitor clock m*, a missing auxiliary clock a* need not to immediately lead into an activation of the safety switch 180.

The deviation unit 220 is adapted to detect a frequency deviation of the monitor clock m*. This is preferably realized by a counter 221. The counter comprises two inputs. The first input receives the auxiliary clock a*. Based on the auxiliary clock a*, a time window is defined, during which the clock cycles of the monitor clock m* are counted. The second input receives the monitor clock m*. Based on the counted clocks during the defined time window, the deviation unit 220 is adapted to decide, whether there is a deviation of the monitor clock m* and whether the clock frequency is too high, too low or much too low. The result is then transmitted to the event analyzer 250 in the above mentioned way. However, it is also possible to transmit the counting result to the event analyzer 250. In this case, the event analyzer 250 has to analyze and to classify a frequency deviation of the monitor clock m*. This would remove all intelligence from the deviation unit 220 and enables a very simple design.

Figure 3:
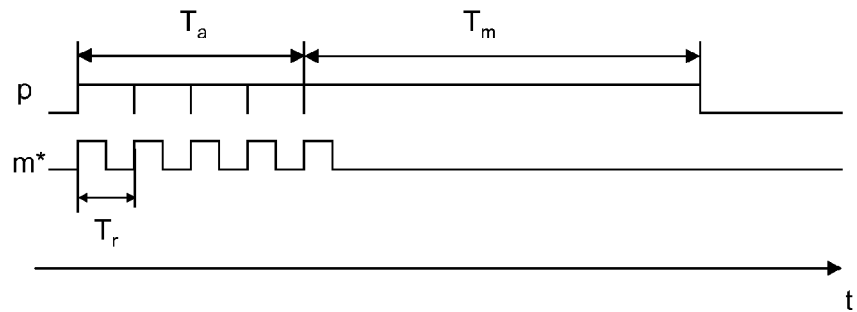
FIG. 3 shows a monitor clock supervised by an activity unit.

FIG. 3 shows a monitor clock supervised in the clock missing unit. In detail, FIG. 3 shows the monitor clock m* and the presence signal p over the time. One monitor clock cycle comprises the periodic length of $T_r$. Assumed, that the monitor clock m* runs error free over an active time $T_a$, each positive clock edge of the monitor clock m* resets the monitor clock missing unit 211 in the activity unit 210. It is assumed, that the first signal, which is output from the start of the monitor clock missing unit 211, is a constant signal with an arbitrary level and that the second signal, which is output after a predetermined missing time $T_m$ of the monitor clock m* comprises a zero level. That is, according to FIG. 3, if the monitor clock m* misses after the active time $T_a$, the monitor clock missing unit 211 needs the missing time $T_m$ to switch to the second signal. The missing time $T_m$ is determined by a predefined number of clock cycles of the auxiliary clock a*.

By means of the presence signal p the activity unit 210 can indicate the missing monitor clock m* to the event analyzer 250.

Figure 4:
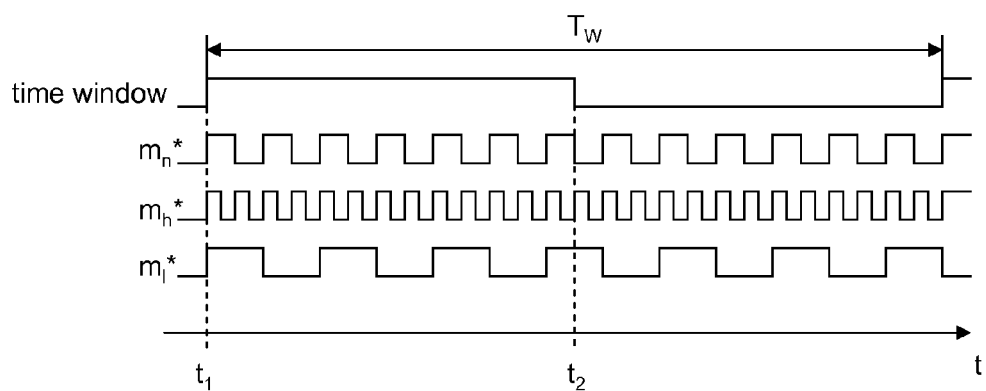
FIG. 4 shows a monitor clock supervised by a deviation unit.
Figure 5:
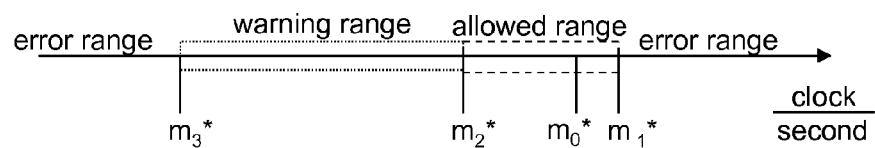
FIG. 5 shows thresholds for generating different clock deviation faults.

FIG. 4 shows a monitor clock m* supervised by the deviation unit 220 and FIG. 5 shows thresholds for generating clock deviation faults. In detail, FIG. 4 shows an example for a time window signal with a predetermined periodic length $T_W$ and three examples for a monitor clock m*. The first monitor clock $m_n*$ runs error free, the second monitor clock $m_h*$ runs too fast and the third monitor clock $m_l*$ runs to slow. As mentioned above, the time window signal defines a time period, during which a number of clocks of the monitor clock m* is counted, wherein the time window is derived from the auxiliary clock a*. That is, the time window signal can be the auxiliary clock a* itself or any other suitably derivation of the auxiliary clock a*. Half of the periodic length $T_W$ of time window signal is used to define the limits $t_1$, $t_2$ of the time period for counting. In the present example, the deviation unit 220 counts 7 clocks for the error free monitor clock $m_n*$ within limits $t_1$, $t_2$ of the time period. In case of the second monitor clock $m_h*$ running too fast, the deviation unit 220 counts 13 clocks within limits $t_i$, $t_2$ of the time period and in case that the monitor clock m* runs too slow, the deviation unit 220 counts only 4 clocks within limits $t_1$, $t_2$ of the time period. That is, by defining suitable thresholds, the deviation unit 220 may be adapted to output error signals for indicating a too high or much too low clock frequency and/or a warning signal for indicating a too low clock frequency. These thresholds are indicated in FIG. 5 showing a number ray for the clocks of the monitor clock m*. The nominal monitoring clock $m_o*$ is located within an allowed range for the monitor clock m*, which is limited by a first monitor clock limit $m_1*$ indicating the limit for a too fast monitor clock m* and a second monitor clock limit $m_2*$ indicating the limit for a too slow monitor clock m*. To outline this allowed range, it is indicated by a dashed square. Monitor clocks m*, which are running at clock frequencies higher than the first monitor clock limit $m_1*$ fall into a first error range, wherein the deviation unit 220 produces the high deviation error dh. Monitor clocks m*, which are running at clock frequencies lower than the second monitor clock limit $m_2*$ and higher than the third monitor clock limit $m_3*$ fall into a warning range, wherein the deviation unit produces the low deviation warning dl1. This warning range is indicated by a pointed square in FIG. 5. That is, monitor clocks m*, which are running at clock frequencies lower than the third monitor clock limit $m_3*$ fall into a second error range, wherein the deviation unit 220 produces the low deviation error dl2. The segmentation into the error, warning and allowed ranges is not limited to the embodiment as described above. For example, it is also possible to introduce a further warning range indicating clock frequencies slightly higher than the first monitor clock limit $m_1*$. Another possibility may be to graduate the warning or error ranges.

Therewith, a higher flexibility for reacting on frequency errors or warnings can be reached because the event analyzer now can analyze the criticality of the frequency errors or warnings.

Figure 6:
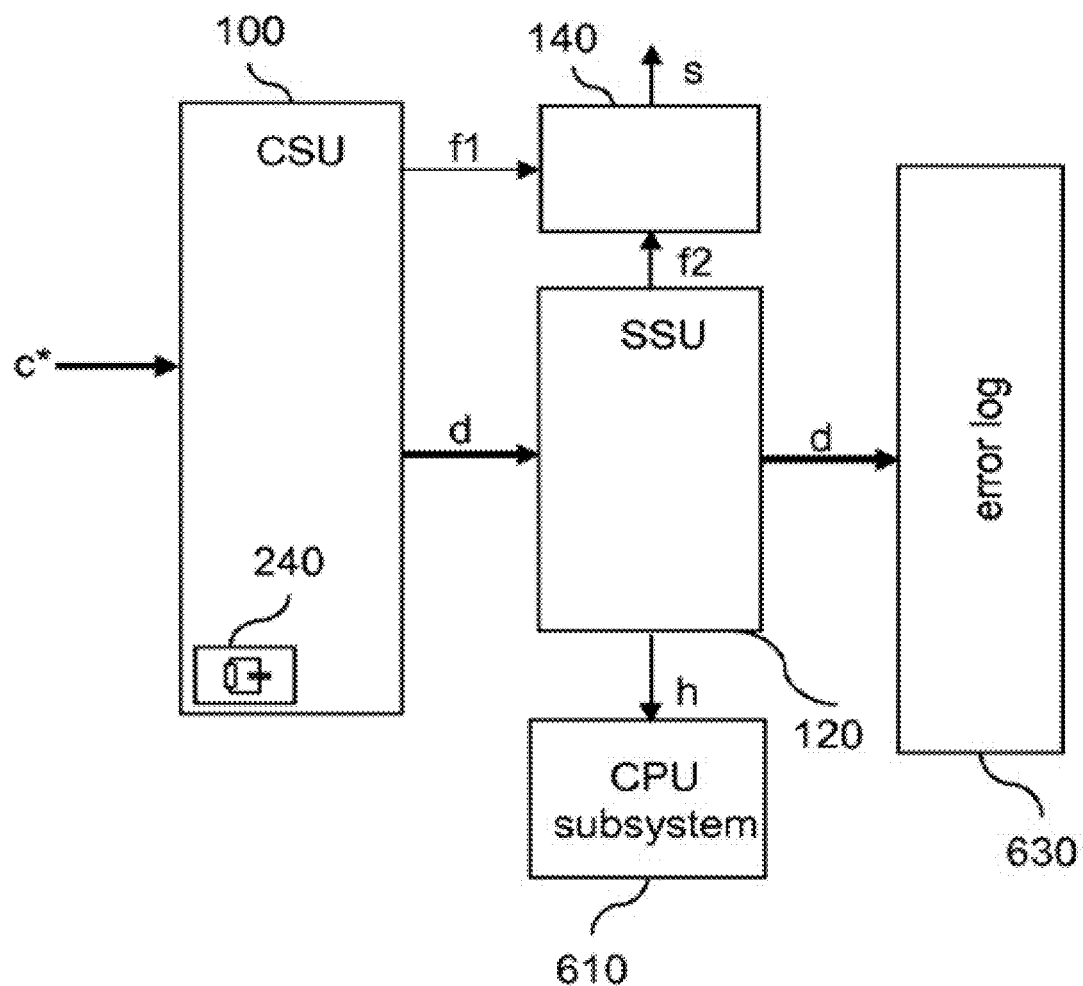
FIG. 6 illustrates the operation of the clock supervision unit according to the invention together with a system supervision unit.

FIG. 6 illustrates the operation of the clock supervision unit 100 according to the invention together with the system supervision unit. The CSU 100 receives the set of periphery clocks c* including the monitor clock m*. As already mentioned, it is also possible the supply the monitor clock m* independently from the periphery clocks c* to the CSU 100. Based on the supplied clocks and the auxiliary clock a* generated internally in the CSU 100, an information signal d is output to the SSU 120. Further, in case of a critical clock fault, the CSU 100 may also be adapted to output a first shutdown initiation signal f1 to the shutdown initiation unit 140. The SSU 120 analyzes the information signal d and provides it to an error logging unit 630. This is a nonvolatile memory keeping the information even after a loss of the power supply to the MCU 10. Further, the SSU 120 outputs an instruction signal h to a CPU subsystem 610, which at least comprises the CPU 160, the memory 161 and the system bus 162 shown in FIG. 1. Therewith, the SSU 120 can initiate software based error handling procedures on clock faults detected by the CSU 100. Another possibility is that the instruction signal h includes an interrupt request for the CPU 160. The interrupt may comprise a reset instruction for individual components of the MCU 10 or the whole MCU 10. The interrupt is a software based error handling and therewith cost-effective to realize. Further, the instruction signal h sent to the CPU 160 will be executed immediately, such that the error handling procedure would not be timely delayed. Simultaneously or alternatively to the instruction signal h, the SSU 120 may output the second shutdown initiation signal f2 to the shutdown initiation unit 140. In the present embodiment, in case of a shutdown, the safety switch 180 is adapted to only break the power supply to the actuator 181 and not to the MCU 10. That is, in case of a critical clock fault, which is identified as leading to a hazard, the MCU 10 will still keep its functionality to log the information signal d. This improves the serviceability of the MCU 10 and the actuator 181.

Figure 7:
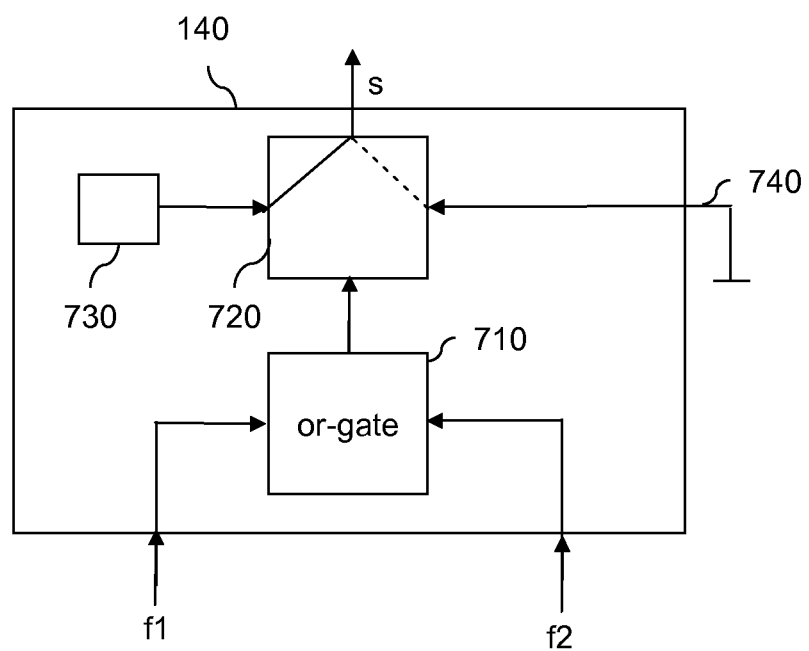
FIG. 7 shows the internal structure of a shutdown initiation unit.

FIG. 7 shows the internal structure of a shutdown initiation unit 140. Thereafter, the shutdown initiation unit 140 comprises an OR-gate 710, a controlled switch 720, an alive signal supplier 730 and a pin 740 connected to ground. The controlled switch 720 initially provides a signal path from the alive signal supplier 730 to the output of the shutdown initiation unit 140. The alive signal supplier 730 may be adapted to generate a suitable shutdown signal s indicating to the safety switch 180, that the MCU 10 operates correctly. Preferably, this signal is a constant high-level signal. The OR-gate 710 receives the first and second shutdown initiation signals f1, f2. If at least one of the signals f1, f2 is received, the OR-gate 710 initiates the controlled switch 720 to change the signal path between the alive signal supplier 730 and the output of the shutdown initiation unit 140 to a signal path between the ground pin 740 and the output of the shutdown initiation unit 140. In this case, the safety switch 180 looses the signal indicating the correct operation of the MCU 10. As a reaction to this the safety switch breaks the power supply for the actuator 181 and thereby performs the shutdown into the safe state. The advantage of the shutdown initiation unit 140 is that there is no active signal necessary to perform the shutdown. Instead, an active shutdown signal s required for keeping the safety switch 180 from performing the shutdown. A simple loss of this steadily present shutdown signal s at the safety switch 180 cannot lead to a hazard.

Alternatively to the above described embodiment alive signal supplier 730 or the whole shutdown initiation unit 140 may also be integrated into the SSU 120. This could especially be advantageous if the alive signal is not a constant high-level signal but a signal that periodically changes its level, similar to a clock signal.

The invention claimed is:

1. An electronic system for analyzing a set of periphery clock signals based on a monitor clock of the set of periphery clock signals and providing information about the set of periphery clock signals, comprising:
    a clock generation unit adapted to receive an external clock signal, derive the set of periphery clock signals based on the external clock signal, and select one of the periphery clock signals as the monitor clock;
    an internal clock generator adapted to generate an auxiliary clock signal independently of the external clock signal;
    an activity unit adapted to detect the presence of the monitor clock based on the auxiliary clock signal and detect the presence of the auxiliary clock signal based on the monitor clock, the activity unit includes a monitor clock missing unit clocked by the auxiliary clock signal and continuously reset by the monitor clock; and
    a deviation unit adapted to detect clock faults in the monitor clock based on the auxiliary clock signal in case that the auxiliary clock signal and the monitor clock are present and adapted to check the remaining clocks in the set of periphery clocks based on the monitor clock, if the monitor clock is present and no clock faults have been detected.

2. The electronic system as claimed in claim 1, wherein the activity unit comprises
    an auxiliary clock missing unit clocked by the monitor clock and continuously reset by the auxiliary clock signal,
    wherein the activity unit is adapted to output a clock missing signal indicating whether one of the monitor clock missing unit or the auxiliary clock missing unit is not reset within a predetermined time.

3. The electronic system as claimed in claim 1, wherein the deviation unit is adapted to receive the monitor clock and the auxiliary clock signal, and to detect a clock fault in the monitor clock based on the auxiliary clock signal.

4. The electronic system as claimed in claim 3, wherein the deviation unit comprises: a monitor clock counter counting a number of clock cycles of the monitor clock within a monitor time window determined based on the auxiliary clock signal, wherein a clock deviation fault is outputted if the number of clock cycles deviates from a predetermined monitor clock frequency within the monitor time window.

5. The electronic system as claimed in claim 4, wherein the clock deviation fault is adapted to indicate: a frequency-high error, if the monitor clock frequency is higher than a first predetermined monitor clock frequency, or a frequency-low warning, if the monitor clock frequency is lower than the second predetermined monitor clock frequency but higher than a third predetermined monitor clock frequency, or a frequency-low error, if the monitor clock frequency is lower than the third predetermined monitor clock frequency, respectively.

6. The electronic system as claimed in claim 1, further including an internal oscillator providing the auxiliary clock signal.

7. The electronic system as claimed in claim 1, wherein the electronic system is adapted to initiate a shutdown of at least of one component connected to the electronic system or included in the electronic system in case of a predetermined clock fault in the at least one periphery clock, in the monitoring clock, in the auxiliary clock or in the external clock.

8. The electronic system as claimed in claim 1, further including a deciding unit connected to the electronic system and adapted to initiate a shutdown of at least one component connected to the electronic system or included in the electronic system or to initiate an error handling procedure based on a clock fault indication outputted by the clock supervision unit.

9. The electronic system as claimed in claim 8, wherein the deciding unit is adapted to initiate the shutdown of the at least one component connected to the electronic system or included in the electronic system, if at least one clock missing error, at least one frequency-low error or at least one frequency-high error is received.

10. The electronic system as claimed in claim 8, wherein the deciding unit is adapted to initiate the error handling procedure if at least one frequency-low warning is received.

11. A method of supervising a plurality of clocks, the method comprising:
   receiving an external clock signal;
   deriving a plurality of peripheral clock signals based on the external clock signal;
   generating an auxiliary clock signal independently of the external clock signal;
   selecting one of the peripheral clock signals as a monitor clock signal;
   monitoring the presence of the monitor clock signal based on the auxiliary clock signal and the presence of the auxiliary clock signal based on the monitor clock signal to detect a missing clock fault if either the monitor clock signal or auxiliary clock signal is missing;
   continuously reset, by the monitor clock, a monitor clock missing unit clocked by the auxiliary clock;
   monitoring for clock frequency deviation faults in the monitor clock based on the auxiliary clock signal; and
   checking the remaining clocks in the set of periphery clocks based on the monitor clock signal, if the monitoring clock signal is present and no clock faults have been detected.

12. The method of claim 11, wherein the external clock signal without modification is included in the plurality of peripheral clock signals and the external clock is selected as the monitor clock.

13. The method of claim 12, wherein the step of checking the remaining clocks comprises deriving clock information including at least one of: the presence of each peripheral clock, information about frequency deviations of each peripheral clock; and the amplitude of each peripheral clock.

14. The method of claim 11, wherein the step of monitoring for clock frequency deviation faults comprises:
   measuring a number of clock cycles of the monitor clock signal within a monitor time window determined by the auxiliary clock; and
   generating a clock frequency deviation fault if the number of clock cycles deviates from a predetermined monitor clock frequency within the monitor time window.

15. The method of claim 14, further comprising:
   classifying the clock fault as a frequency-high error if the monitor clock frequency is higher than a first predetermined monitor clock frequency;
   classifying the clock fault as a frequency low warning if the monitor clock frequency is lower than a second predetermined monitor clock frequency, but higher than a third predetermined monitor clock frequency; and
   classifying the clock fault as a frequency-low error if the monitor clock frequency is lower than the third predetermined monitor clock frequency.

16. The method of claim 15, further comprising:
   initiating a shutdown of at least one component receiving one of the plurality of peripheral clock signals if a frequency-high error, frequency-low error, or missing clock is detected.

17. The method of claim 15, further comprising: initiating an error handling procedure if a frequency-low warning is detected.

* * * * *